United States Patent
Tateno et al.

(10) Patent No.: US 7,301,896 B2
(45) Date of Patent: Nov. 27, 2007

(54) REDUNDANT CHANGEOVER APPARATUS

(75) Inventors: Minoru Tateno, Yokohama (JP);
Hideaki Koyano, Yokohama (JP);
Masato Kobayashi, Yokohama (JP);
Yasushi Yoshino, Yokohama (JP);
Tatsuru Iwaoka, Yokohama (JP);
Kazumaro Takaiwa, Yokohama (JP);
Akio Takayasu, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 1088 days.

(21) Appl. No.: 10/002,741

(22) Filed: Nov. 15, 2001

(65) Prior Publication Data

US 2002/0167897 A1    Nov. 14, 2002

(30) Foreign Application Priority Data

May 14, 2001    (JP)    ............................ 2001-143148

(51) Int. Cl.
*H04J 1/16*    (2006.01)
*H04J 3/14*    (2006.01)

(52) U.S. Cl. ................. 370/227; 370/228; 370/519

(58) Field of Classification Search ............... 370/225, 370/227, 228, 516, 519; 375/79
See application file for complete search history.

(56) References Cited

U.S. PATENT DOCUMENTS 6,282,245 B1 *  8/2001  Oishi et al. ............ 375/240.28
6,512,616 B1 *  1/2003  Nishihara ................... 398/54
6,647,012 B1 * 11/2003  Iketani ................. 370/395.62

FOREIGN PATENT DOCUMENTS

| JP | 58-139227 | 8/1983 |
|---|---|---|
| JP | 05-297976 | 11/1993 |

* cited by examiner

*Primary Examiner*—Jean Gelin
*Assistant Examiner*—Inder Pal Mehra
(74) *Attorney, Agent, or Firm*—Katten Muchin Rosenman LLP

(57) ABSTRACT

A redundant changeover apparatus causing no frame synchronization loss even upon occurrence of changeover between working system and protection system. In case of an in-apparatus synchronization system, when two input signals which are mutually asynchronous in phase are changed over by a changeover switch, a changeover switch, a clock extractor, a PLL circuit, and a clock changing portion transmit signals with clocks before the changeover being gradually changed to clocks after the changeover. Alternatively, in case of an in-apparatus synchronize system, data are separated from clocks so that the data are once changed to data with reference clocks, and then for the data, clocks before the changeover are gradually changed to clocks after the changeover.

12 Claims, 18 Drawing Sheets

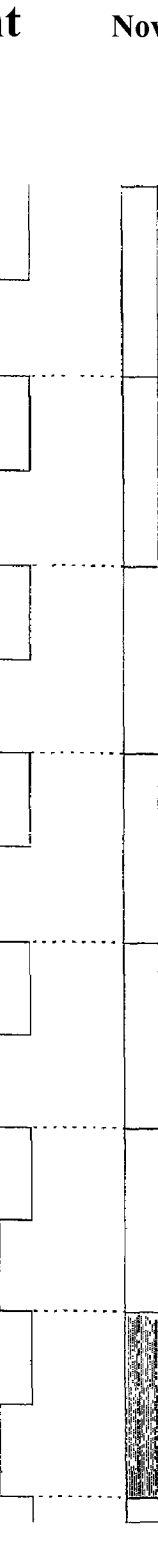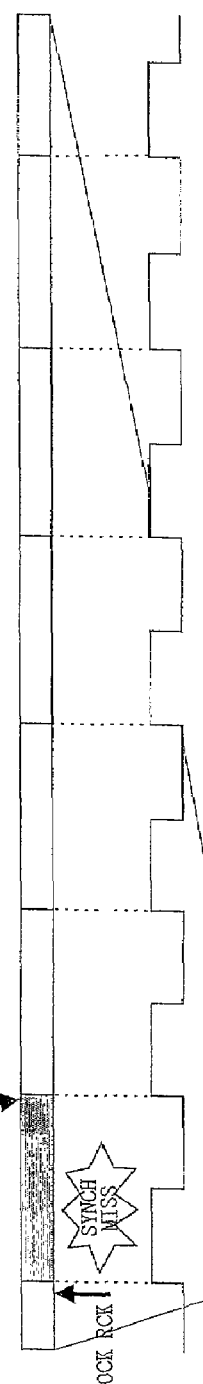
FIG. 17A  WORKING CLOCK
FIG. 17B  WORKING FRAME PHASE
RECEIVER SYNC CLOCK RCK
FIG. 17C  PROTECTION FRAME PHASE
RECEIVER SYNC CLOCK RCK
FIG. 17D  PROTECTION CLOCK
FIG. 17E  WDM TRANSMISSION SIGNAL
INSTANTANEOUS CLOCK SHIFT (WS→PS)

REDUNDANT CHANGEOVER APPARATUS

BACKGROUND OF THE INVENTION

1. Field of the Invention

The present invention relates to a redundant changeover apparatus, and in particular to a redundant changeover apparatus which makes a changeover from a working system to a protection (standby) system when a line failure or a device failure arises, or when a manual changeover is performed in node devices forming a network where transmission lines (optical fibers) are connected in a ring shape.

2. Description of the Related Art

Heretofore, with progresses of optical transmission technology, a wavelength division multiplexing (WDM) technology has been widely used, enabling a plurality of signals by using lights whose wavelength are different from each other to be multiplexed to realize a network capable of a higher transmission and extensively utilized for a transmission line of ITU Recommendation G.707 SONET/SDH device.

An optical ring network using such a WDM technology is shown in FIG. 15. This optical ring network RNW is composed of, in this example, node devices 10-1 to 10-8, among which only the node device 10-6 forms a relaying or repeating node device and the other node devices 10-1 to 10-5, 10-7, and 10-8 respectively form a multiplexing node device.

The multiplexing node devices 10-1 to 10-3 form a network "A" together with transmission devices 11-1 to 11-3 which are also node devices connected thereto respectively. The multiplexing node devices 10-4 and 10-5 form a network "B" together with transmission devices (node devices) 11-4 and 11-5 connected thereto respectively.

Furthermore, the multiplexing node devices 10-7 and 10-8 form a SONET/SDH ring network "C" together with SONET/SDH transmission devices (node devices) 11-6 and 11-7 connected thereto respectively.

It is to be noted that the multiplexing node devices and the transmission devices are occasionally represented by general reference numerals "10" and "11", respectively.

The node devices 10-1 to 10-8 are mutually connected through transmission lines "W" of a working system and transmission lines "P" of a protection system which are respectively duplicated, in which each of the multiplexing node devices 10-1 to 10-5, 10-7, and 10-8 is composed of a transmission line monitor 20, a WDM device 30 performing optical coupling/branching per wavelength, and a redundant changeover apparatus 40 performing a redundant changeover at a network single wavelength channel line, as exemplified shown only in the multiplexing node device 10-5, to perform a wavelength division multiplexing of a subordinate network transmission signal at the WDM device 30 and to perform a failure monitoring of the transmission lines W and P at the transmission line monitor 20. The WDM device 30 is connected to the transmission device 11-5 through the redundant changeover apparatus 40 whereby upon a failure (fault) of the working transmission line W, the redundant changeover apparatus 40 performs the redundant changeover to the protection transmission line P to secure a connection with the transmission device 11-5 for achieving the protection of the transmission lines failed.

Also in the relaying node device 10-6, although not shown, the redundant changeover apparatus 40 similarly performs a changeover from the working transmission line W to the protection transmission line P for the relaying operation.

FIG. 16 shows a prior art example of the redundant changeover apparatus 40 in such a node device.

The redundant changeover apparatus 40 is composed of a frame terminal portion 1, a frequency generator 2, a changeover portion 3, and a frame generator 6.

The frame terminal portion 1 comprises a frame terminal unit 1-1 and a frame synchronizer 1-2 for terminating an overhead and an error correction code of a frame from the signal of the working transmission line W to extract transmission signals from the payload, so that from the frame synchronizer 1-2 a detection result 1-3 as to the synchronization is outputted.

This frame terminal portion 1 is similarly composed of a frame terminal unit 1-4 and a frame synchronizer 1-5 for the protection transmission line P.

The frequency generator 2 comprises a transmission frequency clock extractor 2-1 and a PLL (Phase Locked Loop) circuit 2-2 for the signals of the working transmission line W, and comprises a transmission frequency clock extractor 2-3 and a PLL circuit 2-4 for the signals of the protection transmission line P, so that based on the output signals of the PLL circuits 2-2 and 2-4, the frame synchronizers 1-2 and 1-5 respectively detect the presence/absence of the frame synchronization.

The changeover portion 3 comprises a changeover switches 3-11 and 3-12, in which a working system contact Sw of the changeover switch 3-11 is connected to the frame terminal unit 1-1 and the transmission frequency clock extractor 2-1, and a protection system contact Sp of same is connected to the frame terminal unit 1-4 and the transmission frequency clock extractor 2-3.

Also, a working system contact Sw of the changeover switch 3-12 is connected to the transmission frequency clock extractor 2-1 and a protection system contact Sp of same is connected to the transmission frequency clock extractor 2-3.

The frame generator 6 comprises a frame adder 6-1 which inputs the output signal of the changeover switch 3-11 to be inserted with additional bits such as a frame synchronizing signal, and a frame generating unit 6-2 which inputs the output signal of the changeover switch 3-12 for the generation of a frame to be provided to the frame adder 6-1.

A WDM transmission signal outputted from the redundant changeover apparatus 40 is subject to a frame synchronization by the frame terminal portion 51 comprising a frame terminal unit 52 and a frame synchronizer 53 in a receiver 50.

In such a conventional ring network, a synchronization network is mainstream having a master clock source, from which clocks are provided to the node devices, thereby avoiding synchronization loss upon the redundant changeover.

On the other hand, recently, an asynchronous network is going mainstream so that master clocks may not spread over the node devices, whereas since a transparent transmission for each working system/protection system between node devices would be conducted in an asynchronous mode, changeover operations between the working system and the protection system in a failure such as a transmission failure or a device failure will be followed by instantaneous clock changeovers.

Therefore, it was disadvantageous that the receiver (see FIG. 16) causes therein a frame synchronization loss in frequency and phase. This will be described hereinbelow referring to FIG. 17.

It is now supposed that the phases of a working system clock shown in FIG. 17A and a working system frame shown in FIG. 17B are outside phases of a protection system clock shown in FIG. 17D and a protection system frame shown in FIG. 17C.

Namely, as shown in FIG. 15, the node devices 10-1 to 10-3 and the transmission devices 11-1 to 11-3 forming the network "A" are synchronized with each other, and the node devices 10-4 as well as 10-5 and the transmission devices 11-4 as well as 11-5 forming the network "B" are also synchronized with each other.

Also, the multiplexing node devices 10-7 and 10-8 as well as the transmission devices 11-6 and 11-7 forming the SONET/SDH ring network "C" are mutually in the synchronized state with each other.

However, in many cases, the networks "A", "B", and the SONET/SDH ring network "C" are asynchronous with each other, so that a phase shift or deviation as shown in FIGS. 17A-17D will arise.

Accordingly, when the phase of the working system frame shown in FIG. 17B is instantaneously changed over to that of the protection system frame shown in FIG. 17C by the changeover switches 3-11 and 3-12, the phase of the overhead OH in the WDM transmission signal shown in FIG. 17E outputted from the frame generator 6 is deviated and provided to the receiver 50, in which since there exists no overhead OH at the phase of a receiver clock RCK expected by the frame synchronizer 53, a frame synchronization loss will arise.

Resultantly, this synchronization loss will extend to synchronizations losses ①-⑨ counterclockwise from the node device 10-5 where a changeover has arisen, as shown in FIG. 18, and eventually to the network RNW in its entirety.

Additionally, the re-synchronization of frame requires time for frame synchronization-protecting stages, and the sequence starting from the node device 10-5.

The time for establishing the re-synchronization of all network nodes within the ring is an accumulation of the protection time, requiring a changeover time corresponding to the number of node devices×the protection time, resulting in a practically difficult operation.

SUMMARY OF THE INVENTION

It is accordingly an object of the present invention to provide a redundant changeover apparatus, which can prevent a frame synchronization loss from arising even upon changeover between a working system and a protection system.

For the achievement of the above object, a redundant changeover apparatus according to the present invention is characterized by comprising: a changeover unit to change over two input signals which are mutually asynchronous in phase, an extracting unit to extract clocks from output signals of the changeover unit, a PLL circuit for inputting the extracted clocks, a clock changing unit to provide the output signals with clocks changed to output clocks of the PLL circuit, and a framing unit to frame output signals of the clock changing unit with the output clocks.

Namely according to in the present invention, when two input signals which are asynchronous with each other are changed over by a changeover unit such as an optical switch, a clock extracting unit extracts clocks from output signals of the changeover unit both before and after the changeover.

Then, a clock changing unit changes clocks before the changeover to clocks after the changeover for the signal transmission with the signal frequency being gradually followed by a PLL circuit.

Then, the signal after the clock change is framed by a framing unit with the output clocks of the PLL circuit.

Thus, no rapid change arises in the phase of the output signals upon the changeover from a working system to a protection system, so that such a problem as causing a frame synchronization loss is solved.

Alternatively, a redundant changeover apparatus according to the present invention may comprise: an extracting unit to extract data and clocks respectively of two input signals which are mutually asynchronous in phase, a first and a second reference clock changing unit to change the data with reference clocks inputted externally, a first changeover unit to change over data respectively outputted from the first and the second reference clock changing unit, a second changeover unit to change over both of the extracted clocks, and clock changing unit to gradually change output data of the first changeover unit from clocks before the changeover to clocks after the changeover by the second changeover unit.

Namely, while the present invention as described above performs a redundant changeover of an in-apparatus asynchronous system, this invention adopts an in-apparatus asynchronous system such that data of two input signals which are asynchronous with each other are changed to data with reference clocks inputted externally, by a first and a second reference clock changing unit.

When the data changed with the reference clocks are changed over by a first changeover unit, a clock changing unit provides the output data of the first changeover unit with the clocks before the changeover by a second changeover unit being gradually changed to clocks after the changeover by the second changeover unit which changes over clocks extracted from the above two input signals.

Thus, even upon a redundant changeover of an in-apparatus synchronous system, a frame synchronization loss can be similarly prevented.

For the above reference clocks, in-house clocks or free-running clocks may be employed.

Also, the above clock extracting unit may extract clocks from a wavelength division multiplexing device. It is unnecessary to extract clocks from a transmission device such as a SONET/SDH transmission device.

The above input signals may comprise working input signals and protection input signals from a wavelength division multiplexing device forming a ring network, or working input signals and protection input signals from an arbitrary transmission device such as for SONET/SDH.

Furthermore, a node device comprising the above redundant changeover apparatus provided in duplicate for same transmission lines of a working system and a protection system to generate outputs of the clock changing unit in the working system and the protection system.

In this case, each changeover unit may be commonly provided to each redundant changeover apparatus.

BRIEF DESCRIPTION OF THE DRAWINGS

FIG. 17 is a flow chart showing a prior art operation shown in FIG. 16; and

Throughout the figures, like reference numerals indicate like or corresponding components.

DESCRIPTION OF THE EMBODIMENTS

Figure 1:
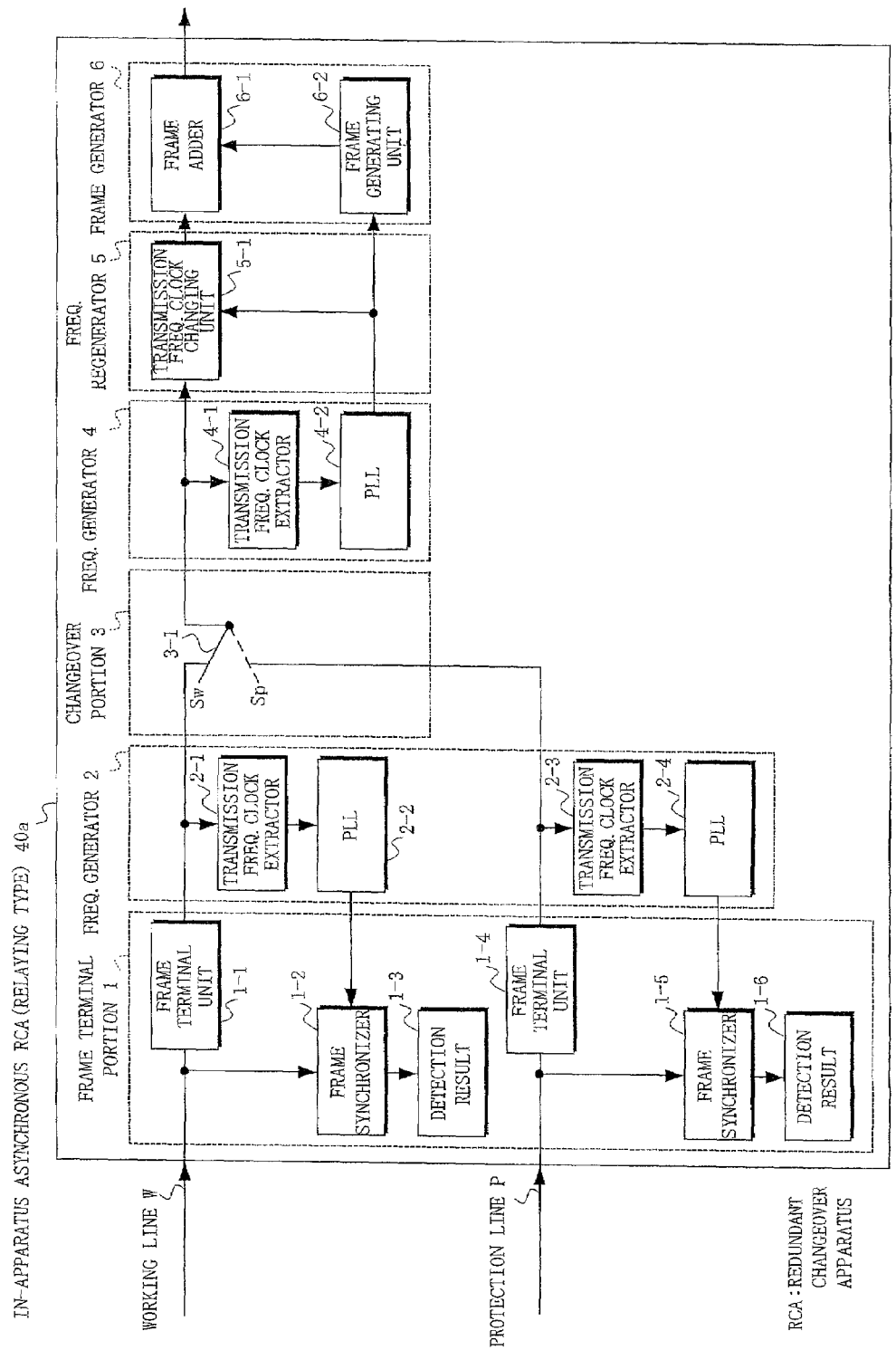
FIG. 1 is a block diagram showing an embodiment (1) of a redundant changeover apparatus according to the present invention.

FIG. 1 shows an embodiment (1) of a redundant changeover apparatus according to the present invention.

Figure 15:
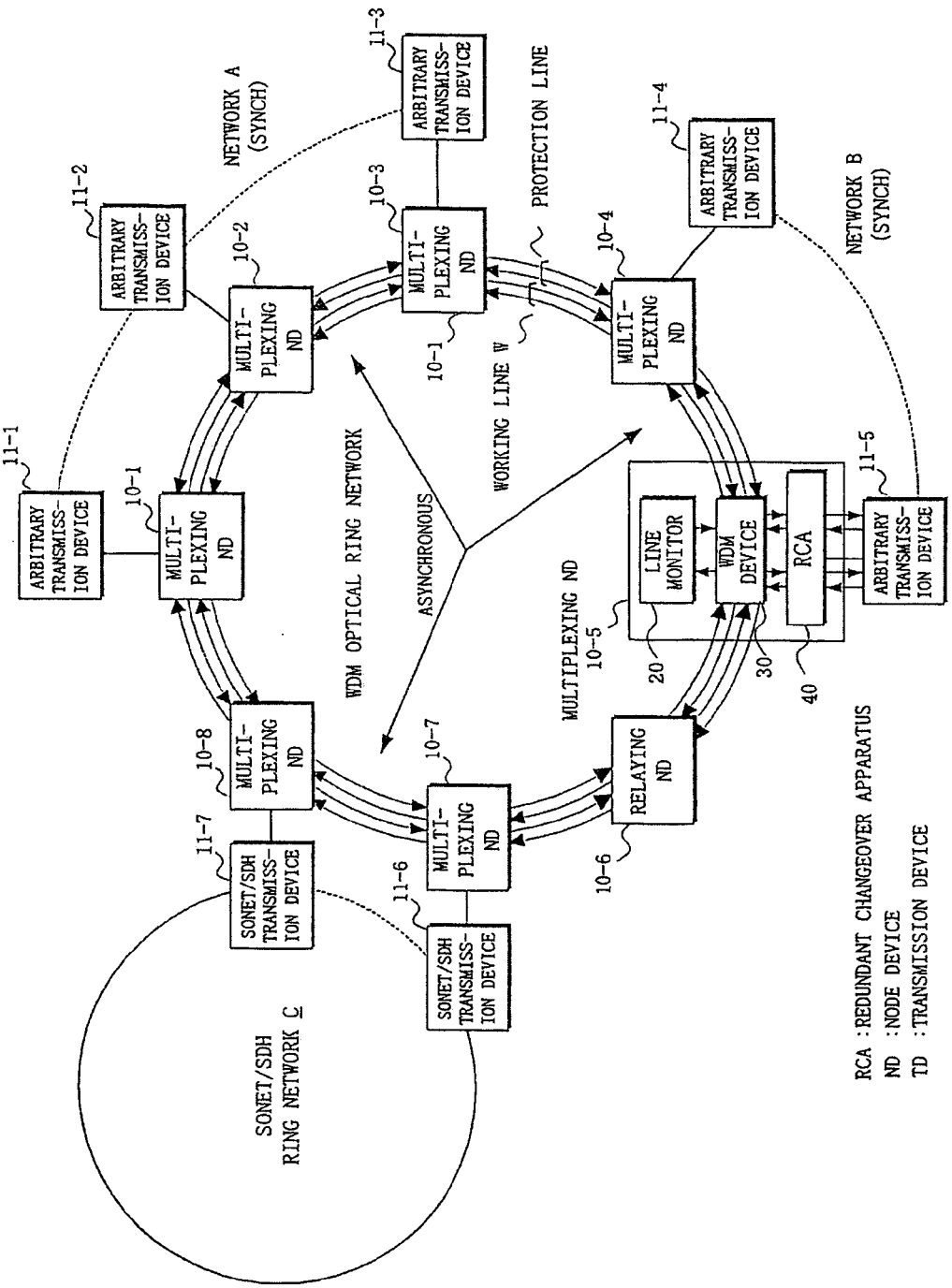
FIG. 15 is a block diagram showing an arrangement of a general optical ring network.

Particularly, this redundant changeover apparatus is one of an in-apparatus asynchronous system, which is used for a relaying node function shown as the relaying node device 10-6 in FIG. 15.

Figure 16:
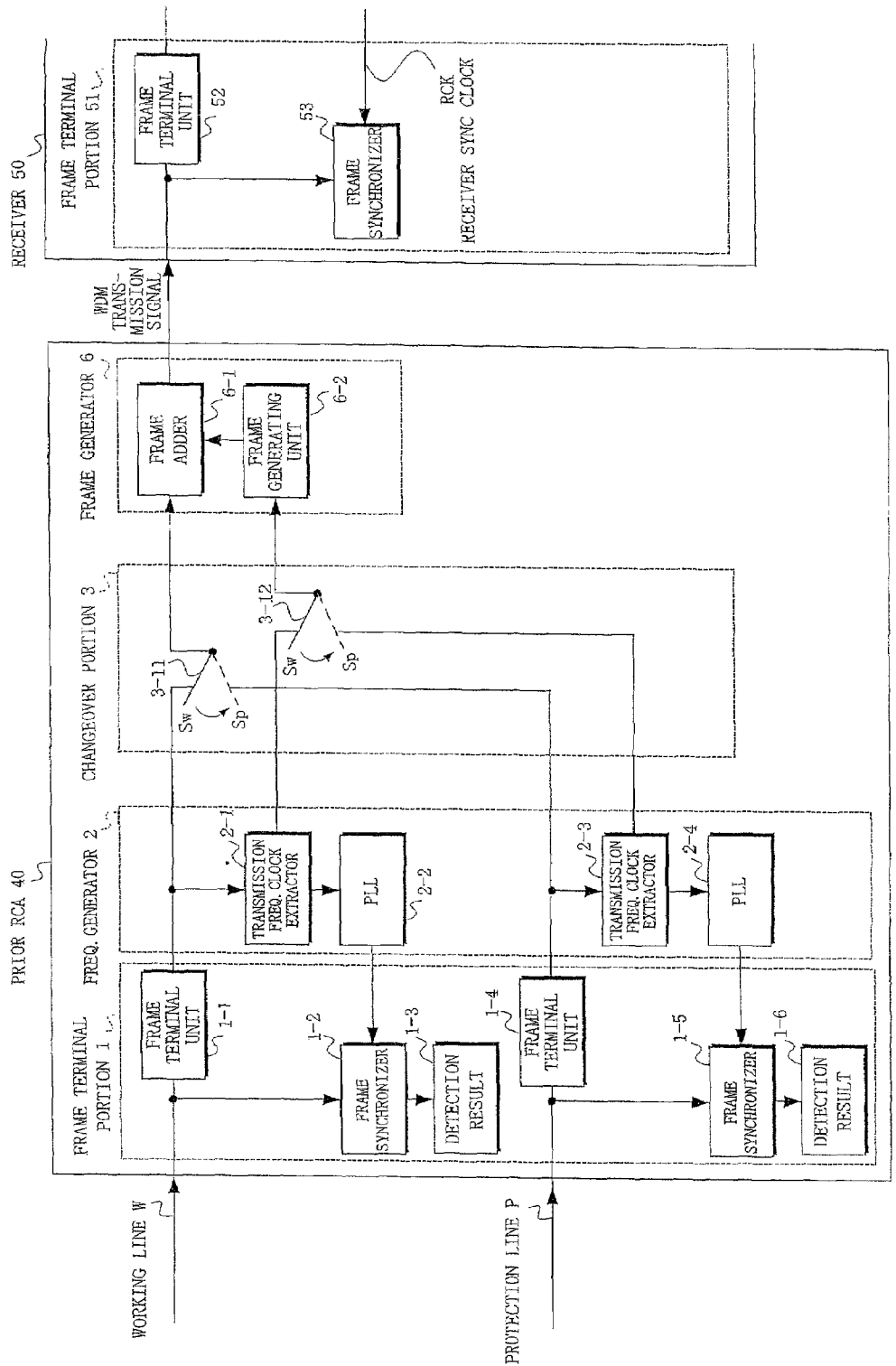
FIG. 16 is a block diagram showing a prior art redundant changeover apparatus.
Figure 18:
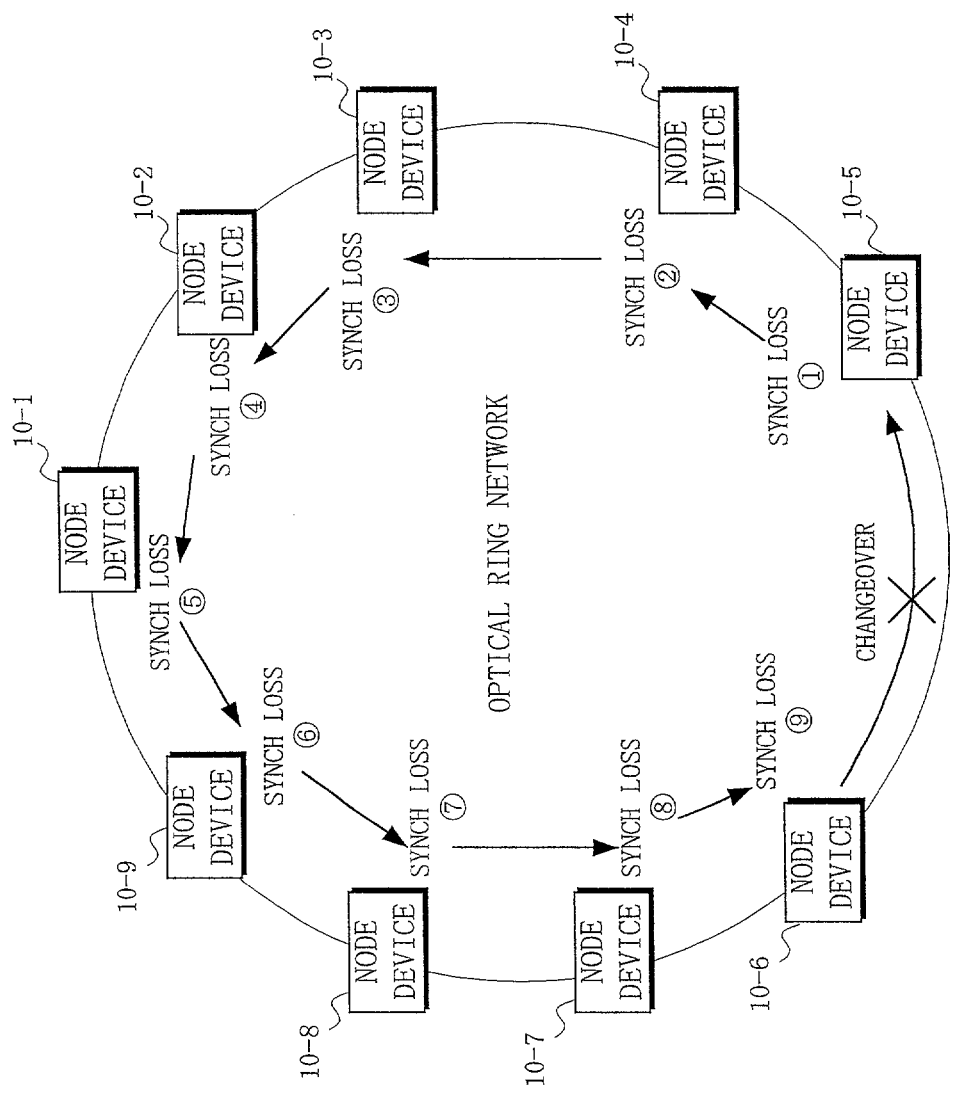
FIG. 18 is a block diagram showing how a synchronization loss is sequentially spread in the prior art.

In this embodiment (1), a frame terminal portion 1 and a frequency generator 2 are the same as the prior art ones shown in FIG. 16, but a changeover portion 3 comprises only a single changeover switch 3-1 having a working system contact Sw connected to a frame terminal unit 1-1 and a transmission frequency clock extractor 2-1, and a protection system contact Sp connected to a frame terminal unit 1-4 and a transmission frequency clock extractor 2-3.

The output signal of the changeover switch 3-1 passes through a frequency generator 4 and a frequency regenerator 5 before being sent to a frame generator 6.

Namely, the frequency generator 4 comprises a transmission frequency clock extractor 4-1 and a PLL circuit 4-2, where a transmission frequency clock in the output signal of the changeover switch 3-1 is extracted by the clock extractor 4-1, and the PLL circuit 4-2 provides as an output a clock such that a clock before the changeover performed by the changeover switch 3-1 is changed to a clock after the changeover by the same.

The frequency regenerator 5 comprises a transmission frequency clock changing unit 5-1 such as a memory latch to write therein the output data of the changeover switch 3-1, which are then read out with the output clock from the PLL circuit 4-2 for performing the clock change, and then sent to the frame generator 6.

The output clock from the PLL circuit 4-2 is similarly sent to the frame generator 6, which frames the input data based on the inputted clock.

It is to be noted that the clock extractor 4-1, the PLL circuit 4-2, and the clock changing unit 5-1 form a clock changing unit.

Figure 2:
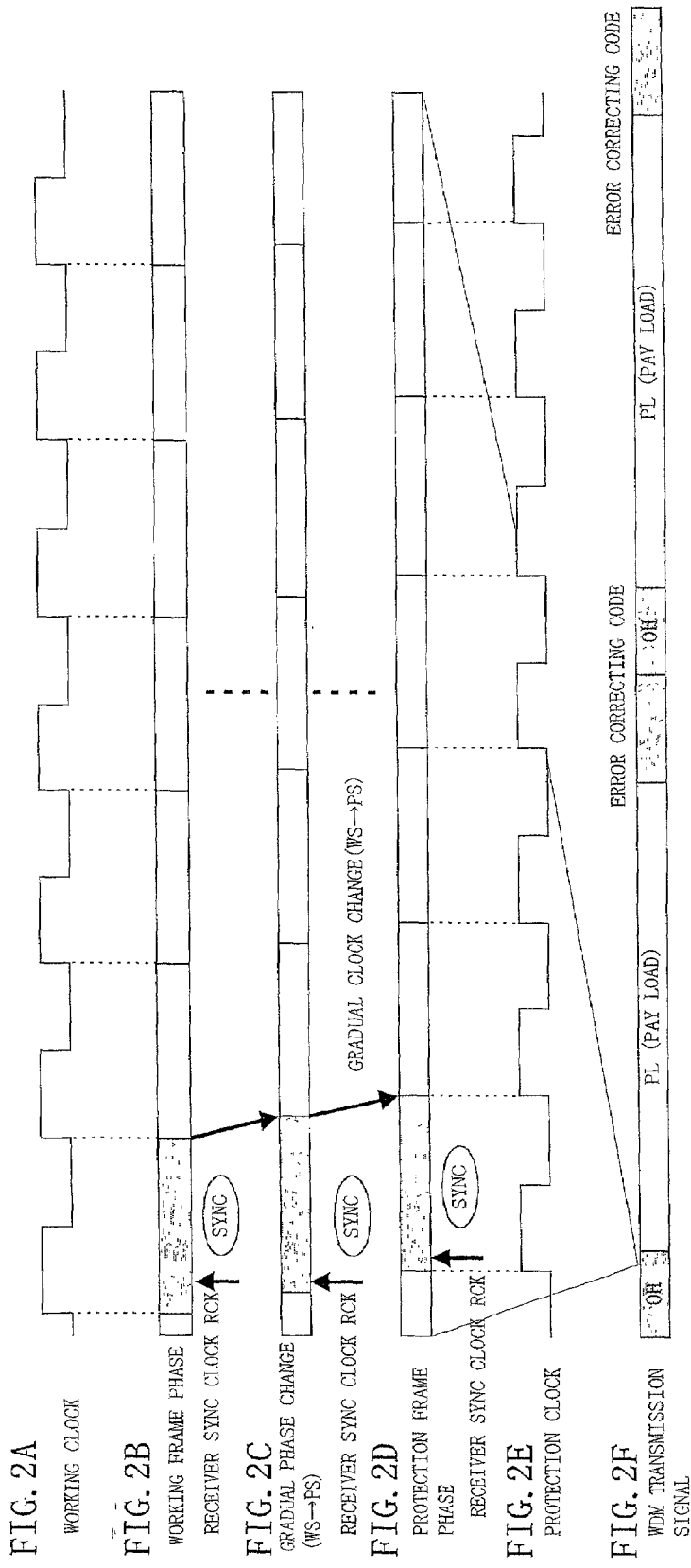
FIG. 2 is a flow chart showing a redundant changeover operation of the present invention.

The operation of this embodiment (1) will now be described referring to a time chart showing in FIG. 2.

It is hereby supposed that when the phases of the working system clock and the working system frame are in the states shown in FIGS. 2A and 2B, the phases of the protection system clock and the protection system frame are respectively deviated from those of the working system as shown in FIGS. 2E and 2D.

The phase of the working system clock is extracted by the transmission frequency clock extractor 4-1 to be provided to the PLL circuit 4-2. When the changeover switch 3-1 is changed over from the working system contact Sw from the protection system contact Sp by the detection results 1-3 and 1-6 or the transmission monitor (see FIG. 15), the transmission frequency clock extractor 4-1 extracts the protection system clock changed to be provided to the PLL circuit 4-2, which does not immediately provide the phase depending on the protection system clock but gradually sifts the phase as shown.

Accordingly, the transmission frequency clock changing unit 5-1 in the frequency regenerator 5 sends the data from the changeover switch 3-1 with the working system clock being gradually changed to the protection system clock to the frame generator 6, so that in the receiver 50 shown in FIG. 16, the frequency of the WDM transmission signal does not vary abruptly, thereby causing no frame synchronization loss.

Hereinbelow, the operation principle how such a clock change is gradually done by the PLL circuit 4-2 will be described.

Figure 3:
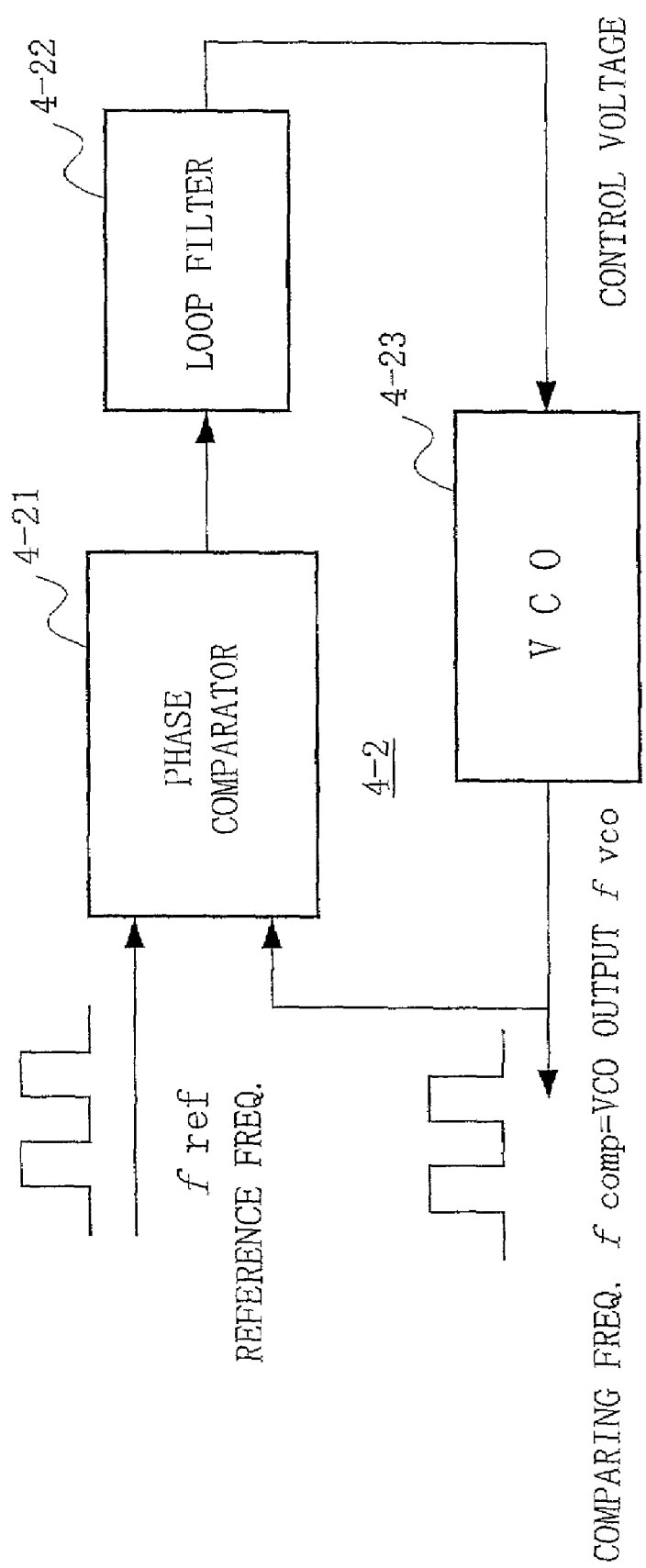
FIG. 3 is a block diagram showing a basic arrangement of a PLL circuit used in a redundant changeover apparatus according to the present invention.

FIG. 3 shows a general arrangement of the PLL circuit 4-2 shown in FIG. 1, which is composed of a phase comparator 4-21 for inputting a reference frequency "$f_{ref}$" and a comparing frequency "$f_{comp}$" ($f_{vco}$) as shown, a loop filter 4-22 for inputting the output signal of the phase comparator 4-21, and a voltage controlled oscillator (VCO) 4-23 for providing the above noted comparing frequency "$f_{comp}$" by receiving the output signal of the loop filter 4-22 as a control voltage.

Namely, the phase comparator 4-21 performs a phase comparison between the reference frequency "$f_{ref}$" and the comparing frequency "$f_{comp}$" generated by the free running oscillation of the voltage controlled oscillator 4-23, and outputs the phase difference component as a phase difference signal in the form of pulse, the AC component of which is intercepted through the loop filter 4-22 composed of an integration circuit and a low pass filter to obtain only the DC component.

By applying the above DC signal to the control terminal of the voltage controlled oscillator 4-23 having a predetermined free running frequency as a control voltage, the comparing frequency is made consistent with the reference frequency.

Because of the loop filter 4-22 having an integration function as mentioned above, even if the reference frequency "$f_{ref}$" provided to the phase comparator 4-21 abruptly varies, the control voltage to the voltage controlled oscillator 4-23 outputted from the loop filter 4-22 gradually varies so that the comparing frequency "$f_{comp}$" gradually follows the reference frequency "$f_{ref}$". Therefore, it becomes possible to transmit the output data with the clock before the changeover performed by the changeover switch 3-1 being gradually changed to the clock after the changeover.

Figure 4:
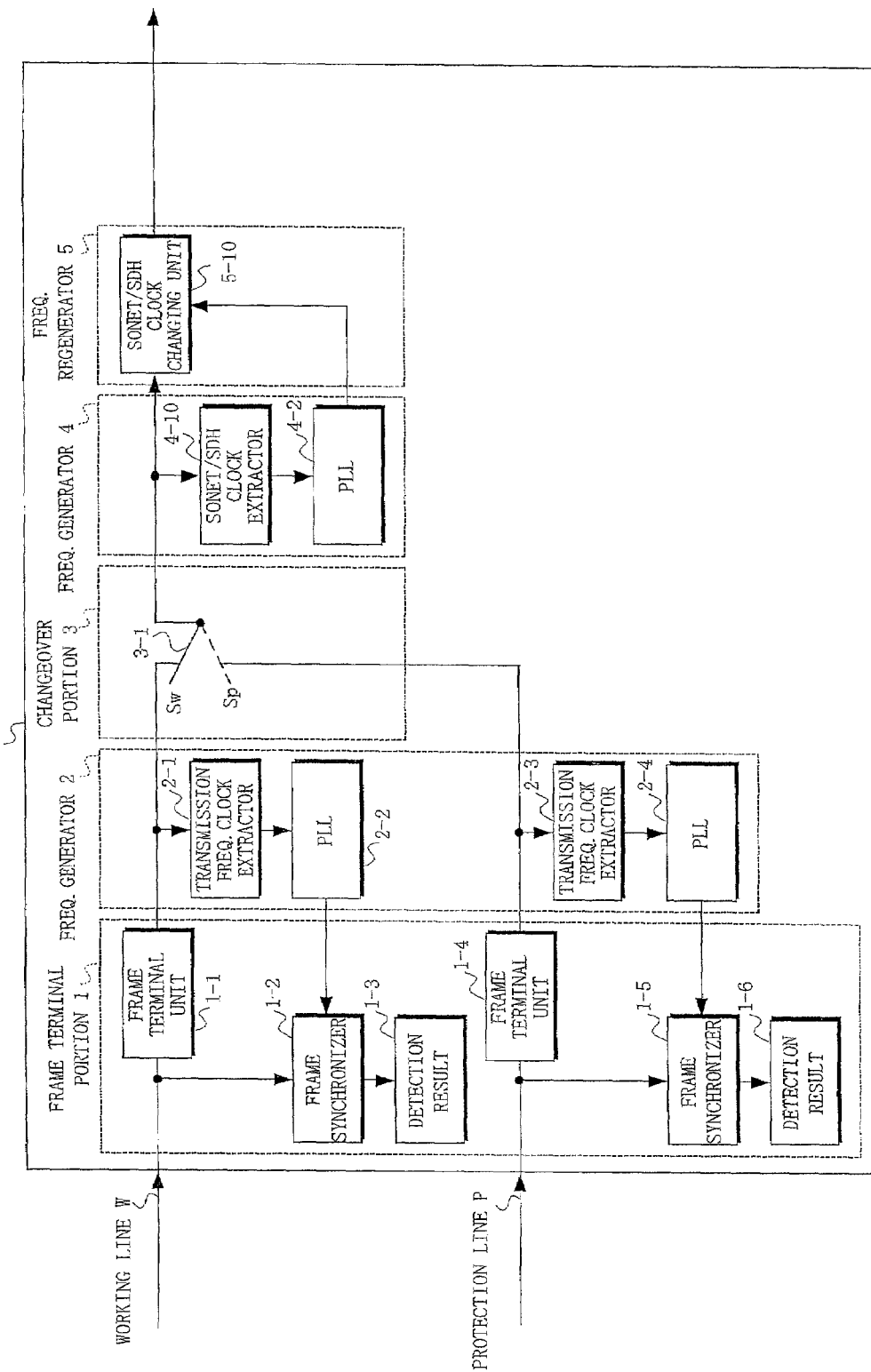
FIG. 4 is a block diagram showing an embodiment (2) of a redundant changeover apparatus according to the present invention.

FIG. 4 shows an embodiment (2) of a redundant changeover apparatus according to the present invention. This embodiment (2) is different from the embodiment (1) in that the frequency generator 4 substitute a SONET/SDH clock extractor 4-10 for the transmission frequency clock extractor 4-1, substitute a SONET/SDH clock changing unit 5-10 for the transmission frequency clock changing unit 5-1 in the frequency regenerator 5, and eliminates the frame generator 6.

Namely, this redundant changeover apparatus 40b is used for dropping in the multiplexing node devices other than the relaying node device 10-6 in the optical ring network shown in FIG. 15.

Therefore, the clock extractor 4-10 extracts the SONET/SDH clock, not the transmission frequency clock, so that the clock changing unit 5-10 outputs the data with the SONET/SDH clock changed from the transmission frequency clock. Since the output data of the clock changing unit 5-10 are not required to be framed, they are to be directly sent to any transmission device or SONET/SDH transmission device.

Figure 5:
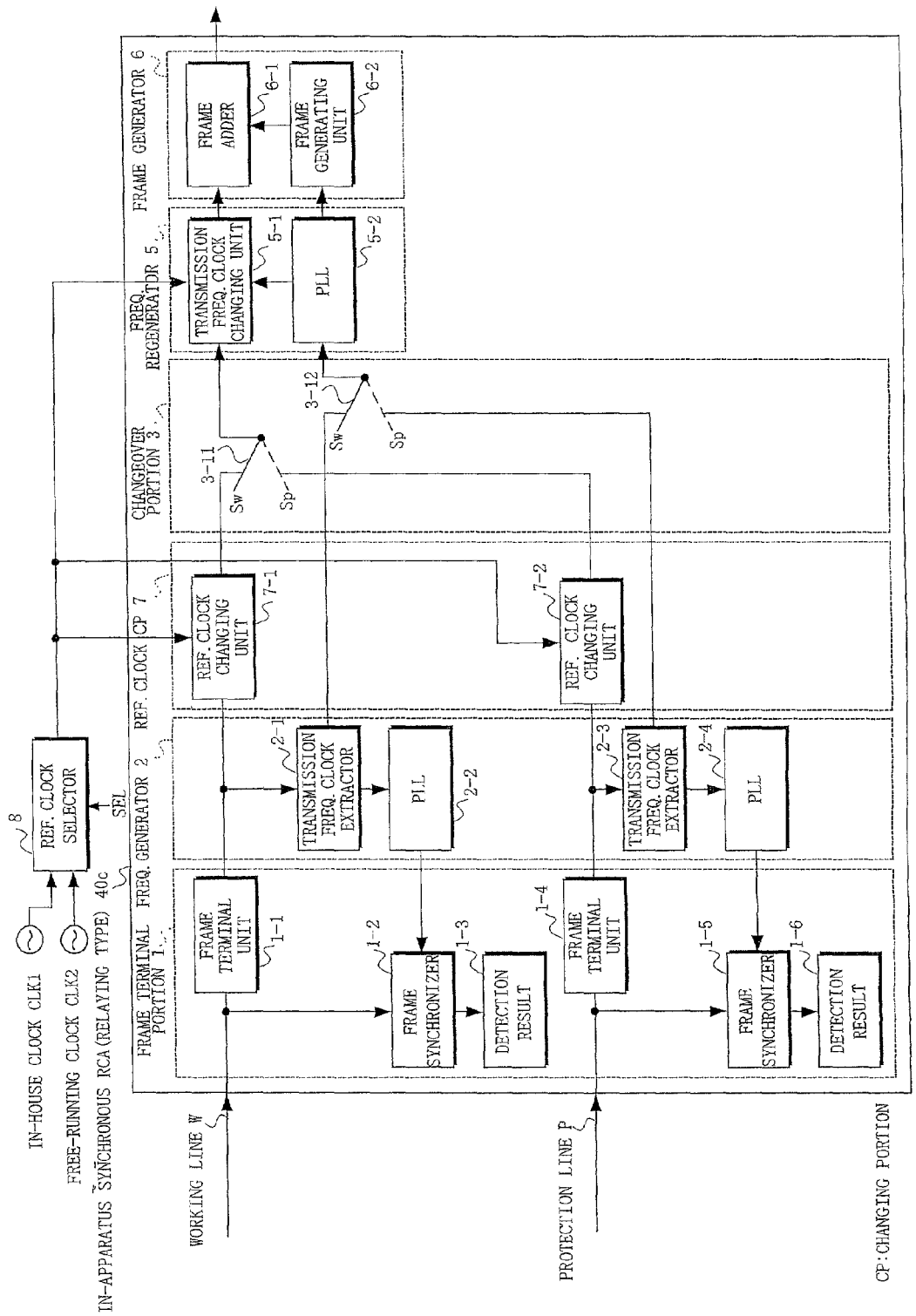
FIG. 5 is a block diagram showing an embodiment (3) of a redundant changeover apparatus of the present invention.

FIG. 5 shows an embodiment (3) of a redundant changeover apparatus according to the present invention. This embodiment (3) is different from the above-mentioned embodiments (1) and (2) in that a reference clock changing unit 7 and a reference clock selector 8 are further provided, and the changeover portion 3 comprises two changeover switches 3-11 and 3-12.

Namely, while the above mentioned embodiments (1) and (2) adopt "in-apparatus asynchronous system" which makes no synchronization by particularly using the reference clock in the redundant changeover apparatus 40, the embodiments (3) adopts "in-apparatus synchronous system" in which the working system data have the reference clock changed by the reference clock changing unit 7-1, and the protection system data as the reference clock changed by the reference clock changing unit 7-2.

The reference clock provided to the reference clock changing units 7-1 and 7-2 are furnished from the reference clock selector 8 which selects an in-house clock CLK1 or a free-running clock CLK2 based on a select signal SEL.

The changeover switch 3-11 has a connection so as to mutually change over the output data of the reference clock changing units 7-1 and 7-2. Also, the changeover switch 3-12 has a connection so as to mutually change over the transmission frequency clocks of the working system and the protection system respectively extracted by the transmission frequency clock extractors 2-1 and 2-3.

The data changed to have the reference clock outputted from the changeover switch 3-11 are provided to the transmission frequency clock changing unit 5-1 in the frequency regenerator.

Also, the transmission frequency clock outputted from the changeover switch 3-12 is provided to the PLL circuit 5-2.

To the transmission frequency clock changing unit 5-1 the reference clock is provided from the reference clock selector 8, so that the reference clock enables the data outputted from the changeover switch 3-11 to be written and the outputted clock from the PLL circuit 5-2 enables the same to be read out. Therefore, the data outputted from the transmission frequency clock changing unit 5-1 are to be sent to the frame generator 6, with the transmission frequency clock of the working system being gradually changed to that of the protection system as in the case of the embodiments (1) and (2), thereby preventing the frame synchronization loss.

Figure 6:
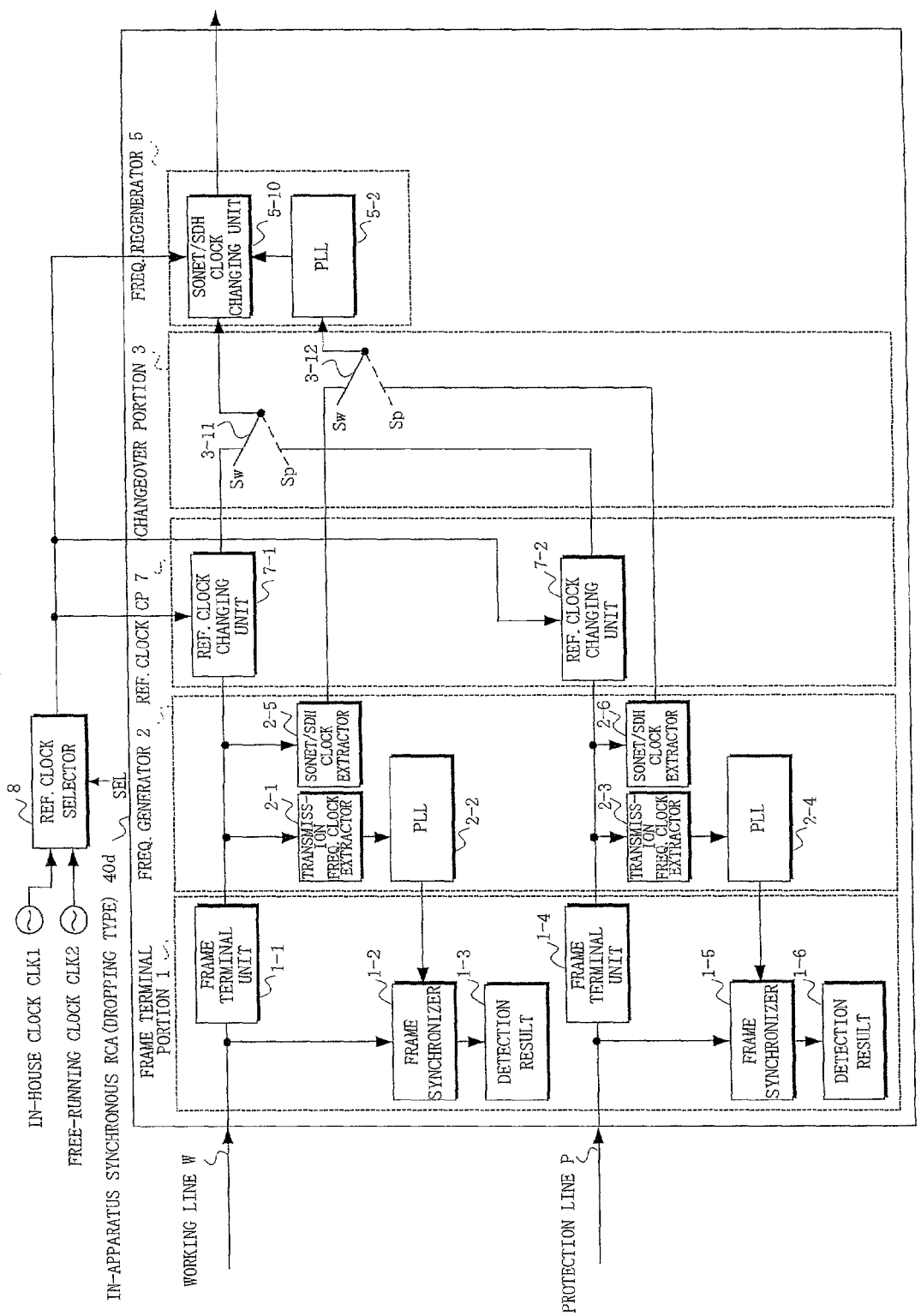
FIG. 6 is a block diagram showing an embodiment (4) of a redundant changeover apparatus of the present invention.

FIG. 6 shows an embodiment (4) of a redundant changeover apparatus according to the present invention. This embodiment (4) is different from the above-mentioned embodiment (3) in that the frequency generator 2 is provided with a SONET/SDH clock extractor 2-5 for the data of the working system and with a SONET/SDH clock extractor 2-6 for the transmission signal of the protection system, and that clocks extracted by the clock extractors 2-5 and 2-6 are respectively provided to the working system contact Sw and protection system contact Sp of the changeover switch 3-12.

Also, in the frequency regenerator 5, a SONET/SDH clock changing unit 5-10 is substituted for the transmission frequency clock changing unit 5-1.

Namely, while the above-mentioned embodiment (3) is applied to the relaying node device 10-6 shown in FIG. 15, this embodiment (4) has a dropping function in the multiplexing node devices other than the relaying node device 10-6, and achieves redundant changeover to any transmission device or SONET/SDH transmission device that is a subordinate node device.

Figure 7:
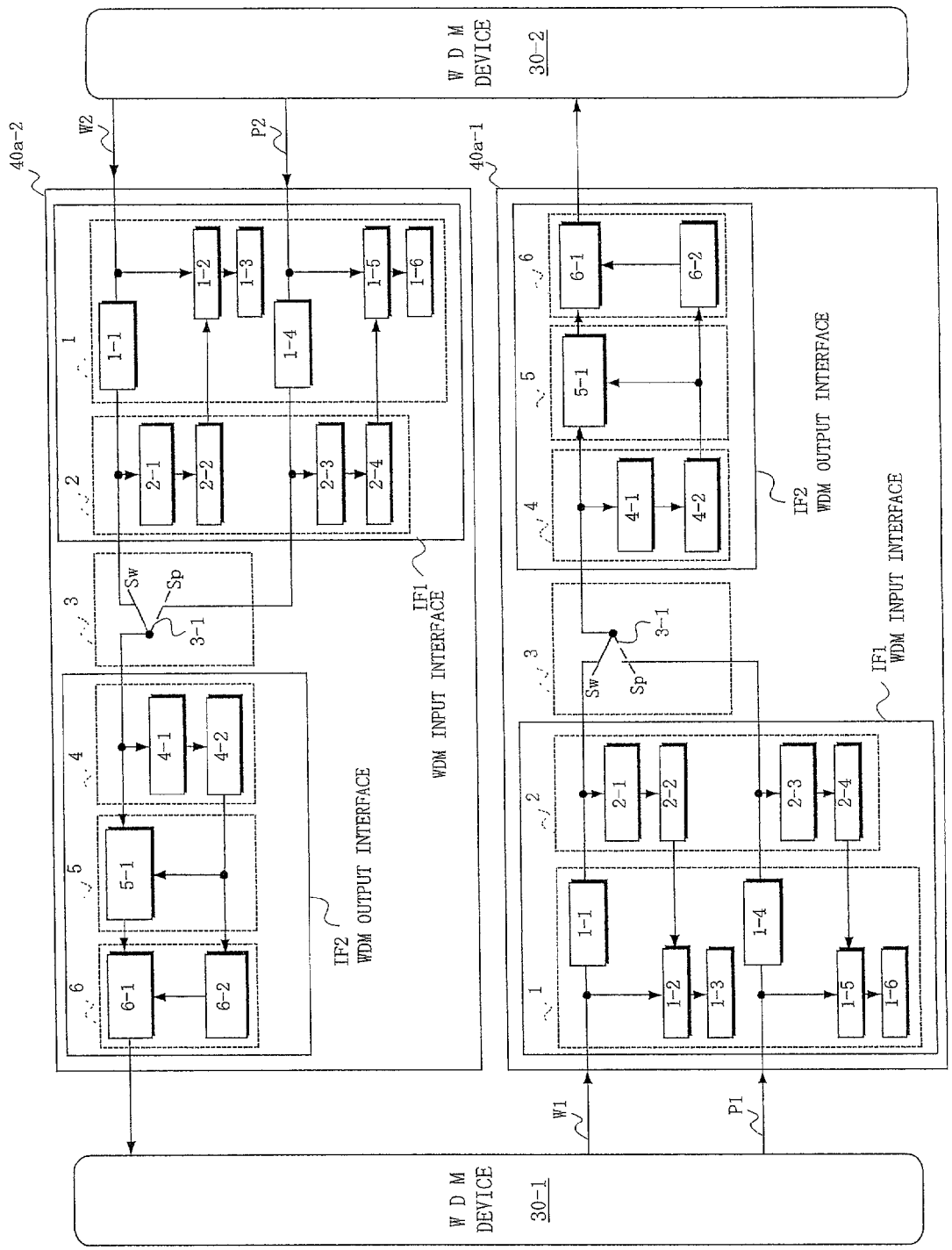
FIG. 7 is a block diagram showing an application, between WDM devices, of the embodiment (1) of a redundant changeover apparatus according to the present invention.

FIG. 7 shows an application example of the embodiment (1) of the present invention shown in FIG. 1, in which there are provided in-apparatus asynchronous system-redundant changeover apparatuses 40a-1 and 40a-2 respectively having the same arrangement as the embodiment (1) in the counterclockwise direction and clockwise direction of the ring network RNW shown in FIG. 15.

These redundant changeover apparatuses 40a-1 and 40a-2 are employed in the relaying node device 10-6 shown in FIG. 15 and the like as mentioned above.

Therefore, both sides of the redundant changeover apparatuses 40a-1 and 40a-2 are sandwiched by WDM devices 30-1 and 30-2 in the adjoining multiplexing node devices.

Namely, the working transmission line W1 and the protection transmission line P1 from the left side WDM device 30-1 are connected to the changeover portion 3 through a WDM input interface IF1 composed of the frame terminal portion 1 and the frequency generator 2 in the lower redundant changeover apparatus 40a-1, and the output signal thereof is sent to the right side WDM device 30-2 through a WDM output interface IF2 composed of the frequency generator 4 and the frequency regenerator 5.

Since this signal flow should be similarly applied to the signal flow of the transmission lines W2 and P2 with respect to the left side WDM device 30 from the right side WDM device 30-2, the upper redundant changeover apparatus 40a-2 is similarly composed of the WDM input interface IF1, the changeover portion 3, and the WDM output interface IF2.

Thus, between the WDM devices 30-1 and 30-2, a relaying operation can be achieved without frame synchronization loss.

Figure 8:
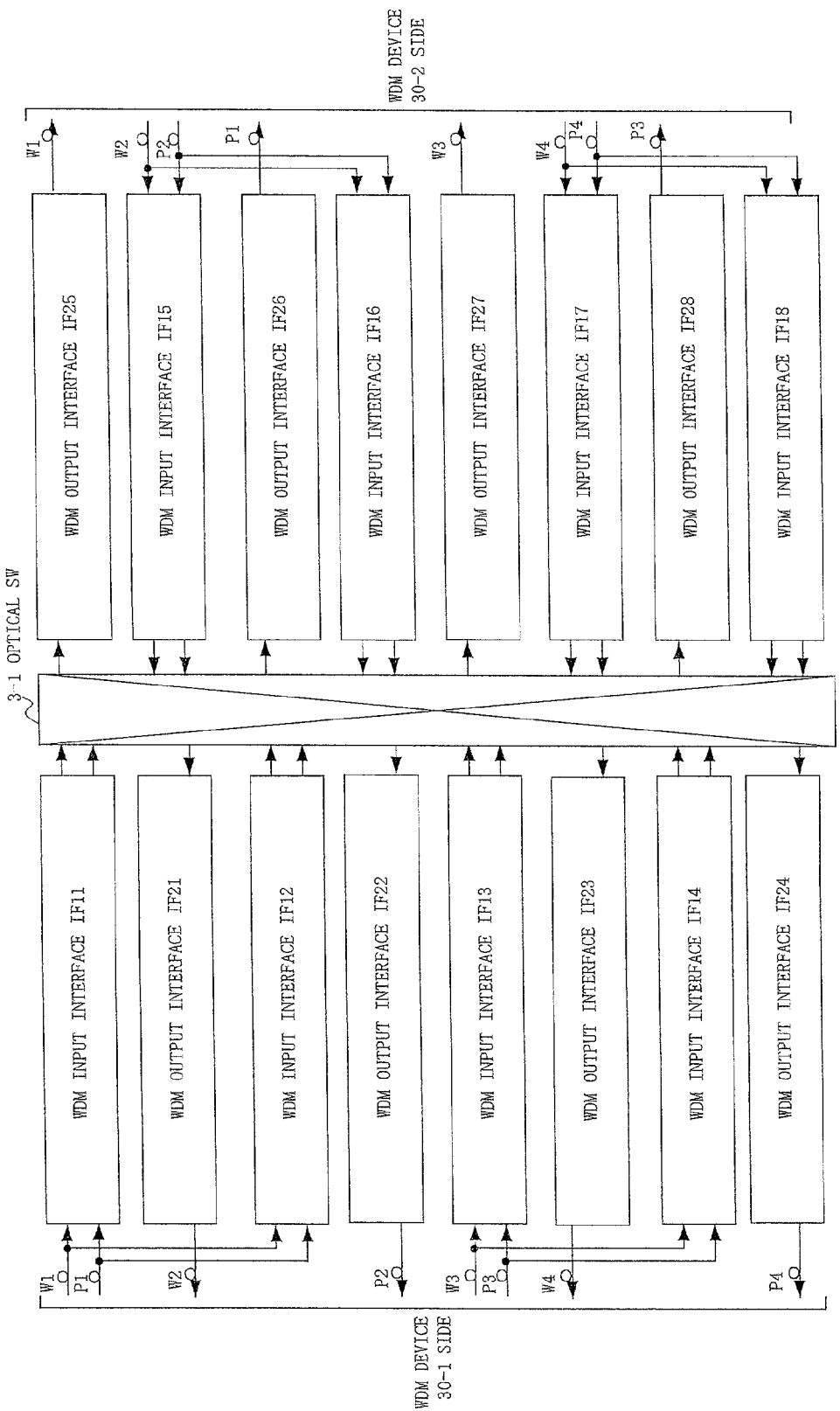
FIG. 8 is a block diagram showing a modification to the application of the embodiment (1) shown in FIG. 7.

FIG. 8 shows a modification of the application example of the embodiment (1) shown in FIG. 7.

This modification has an arrangement (quadruplex arrangement) having two transmission lines respectively for the clockwise direction and counter clockwise direction of the working transmission line W and the protection working line P in the optical ring network RNW shown in FIG. 15.

Namely, since the achievement of the duplicated network RNW in FIG. 15 can not be realized with a single output signal for the redundant changeover apparatuses 40a-1 and 40a-2 in FIG. 7 and so requires two output signals, each is provided in duplicate (in parallel) so as to provide the input signals to the WDM devices 30-1 and 30-2 for both of the working system and the protection system. This is further duplicated, resulting in a totally quadruplex system. It is to be noted that either the upper half or the lower half is enough for constructing the ring network shown in FIG. 15.

As regards the quadruplex arrangement, in the counter clockwise direction from the WDM device 30-1 to the WDM device 30-2, working transmission lines W1 and W3 and the protection transmission lines P1 and P3 are provided, while in the clockwise direction, working transmission lines W2 and W4 and the protection transmission lines P2 and P4 are provided.

As regards one of them, that is a duplicate arrangement (upper part) the transmission lines W1 and P1 is connected to the WDM input interface IF11, which corresponds to the input interface IF1 in FIG. 7, and also connected to the WDM input interface IF12 in parallel thereto.

The WDM input interfaces IF11 and IF12 are respectively connected to the working transmission line W1 and the protection transmission line P1 through the optical switch 3-1 provided commonly to all of the interfaces and respectively through the WDM output interfaces IF25 and IF26 which correspond to the WDM output interface IF2 in FIG. 7.

On the other hand, in the clockwise direction from the WDM device 30-2 to the WDM device 30-1, WDM input interfaces IF15 and IF16 are connected in parallel with the working transmission line W2 and the protection transmission line P2, and respectively connected to the transmission lines W2 and P2 respectively from the WDM output interfaces IF21 and IF22 through the optical switch 3-1.

The relationship between the transmission lines W1, W2 and P1, P2 is similarly applied to the other duplicated arrangement (lower half), in which working transmission lines W3, W4 and the protection transmission lines P3, P4 are provided to achieve the redundant changeover with the WDM input interfaces IF13, IF14, IF17, IF18 and the WDM output interfaces IF23, IF24, IF27, IF28.

Figure 9:
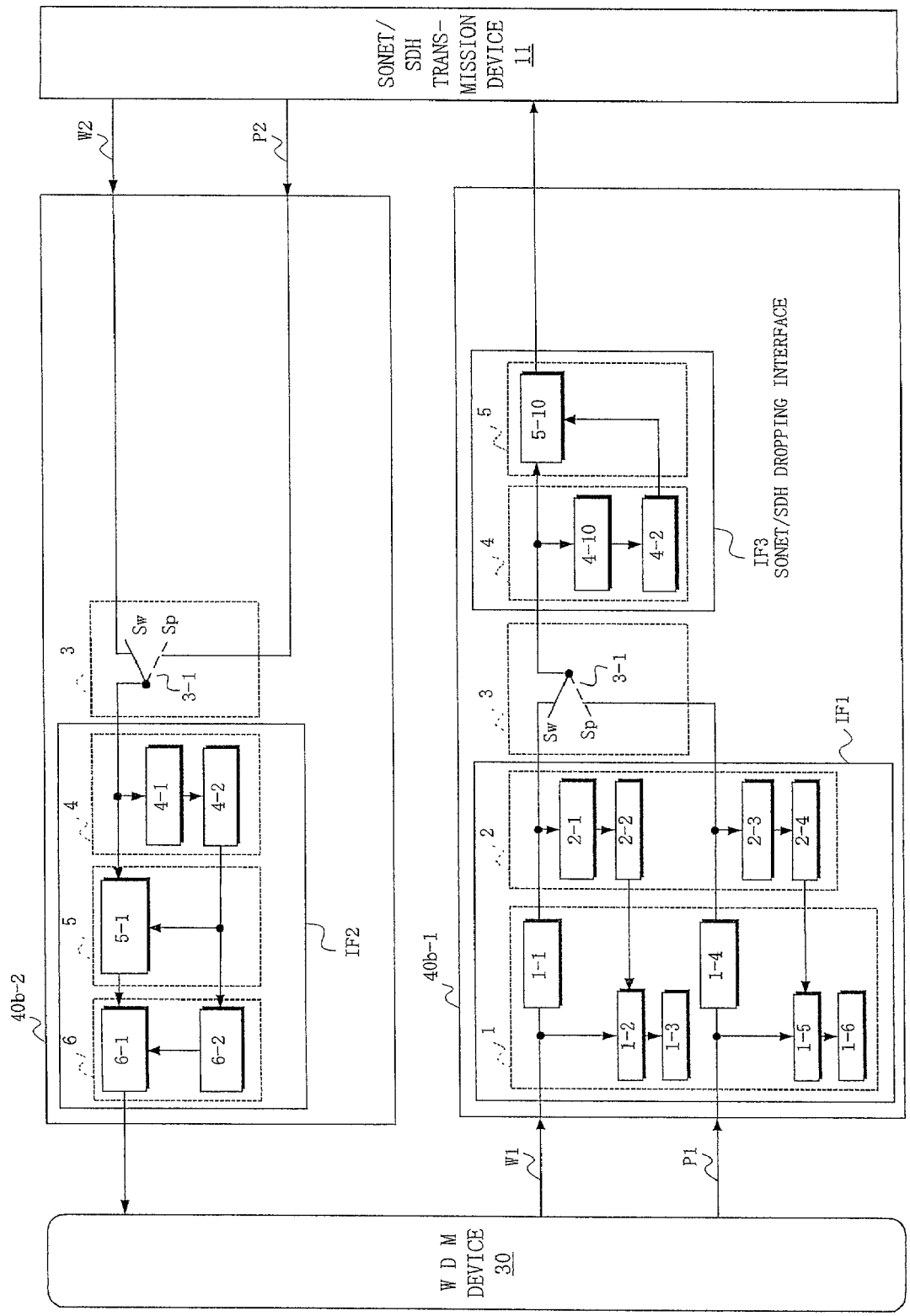
FIG. 9 is a block diagram showing an application, for adding/dropping, of the embodiment (2) of a redundant changeover apparatus according to the present invention.

FIG. 9 shows an application example of the embodiment (2) shown in FIG. 4.

Namely, in the working transmission line W1 and the protection transmission line P2 from the WDM device 30 to the SONET/SDH transmission device 11, the arrangement of the embodiment (2) in FIG. 4 is inserted as it is, in which the frame terminal portion 1 and the frequency generator 2 form the WDM input interface IF1, and the frequency generator 4 and the frequency regenerator 5 form a SONET/SDH dropping interface IF3.

On the other hand, in the working transmission line W2 and the protection transmission line P2 from the SONET/SDH transmission device 11 to the WDM device 30, the frame terminal portion 1 and the frequency generator 2 in the embodiment (2) shown in FIG. 4 is not required, so that the working transmission line W2 and the protection transmission line P2 are directly connected to the changeover switch 3-1 from the SONET/SDH transmission device 11.

Also, for providing the output signal of the changeover switch 3-1 to the WDM device, in addition to the frequency generator 4 and frequency regenerator 5, a frame generator 6 composed of a frame adder 6-1 and a frame generating unit 6-2 is provided, in which the frequency generator 4, the frequency regenerator 5, and the frame generator 6 form a WDM output interface IF2 to the WDM device 30 as also shown in FIG. 7.

Thus, in the dropping route from the WDM 30 to the SONET/SDH transmission device 11, a redundant changeover can be performed by the redundant changeover apparatus 40b-1, while in the adding (inserting) route from the SONET/SDH transmission device 11 to the WDM device 30, a redundant changeover can be performed by the redundant changeover apparatus 40b-2, without frame synchronization loss.

Figure 10:
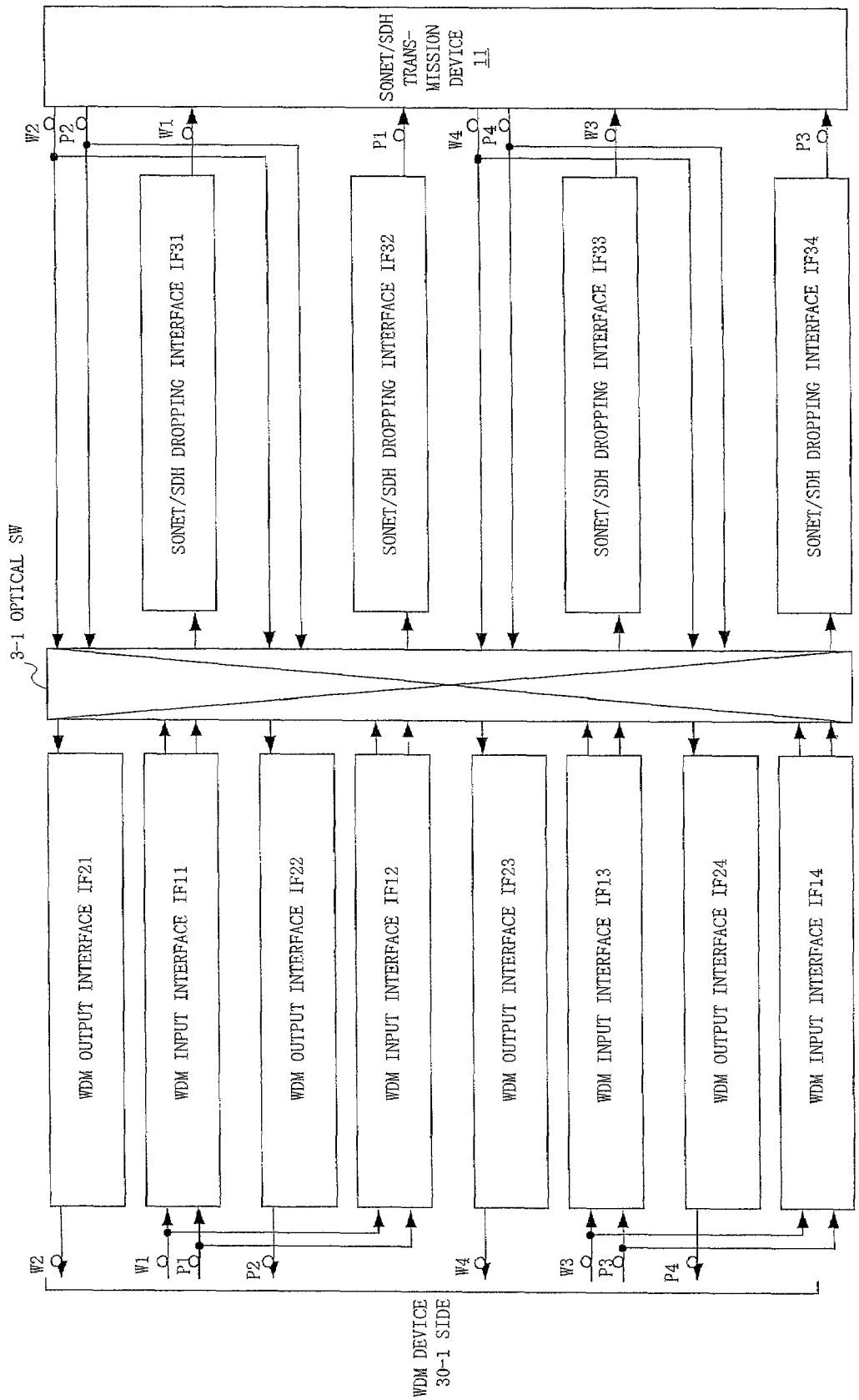
FIG. 10 is a block diagram showing a modification to the application of the embodiment (2) shown in FIG. 9.

FIG. 10 shows a modification of the application example of the embodiment (2) shown in FIG. 9. Also in this modification, as in the modification in FIG. 8, a quadruplex transmission line is set up, that is four working transmission lines W1-W4 and four protection transmission lines P1-P4 connect the WDM device 30-1 to the SONET/SDH transmission device 11, and the WDM input interfaces IF11-IF14 and WDM output interfaces IF21-IF24 are provided between the WDM device 30-1 and the optical switch 3-1 as in the modification shown in FIG. 8.

Also, between the optical switch 3-1 and the SONET/SDH transmission device 11, only the SONET/SDH dropping interface IF3 in the redundant changeover apparatus 40b-1 shown in FIG. 9 is related, so that the working transmission line W1, the protection transmission line P1, the working transmission line W3, and the protection transmission line P3 are respectively provided with a dropping interfaces IF31-IF34, which is different from the modification in FIG. 8.

Figure 11:
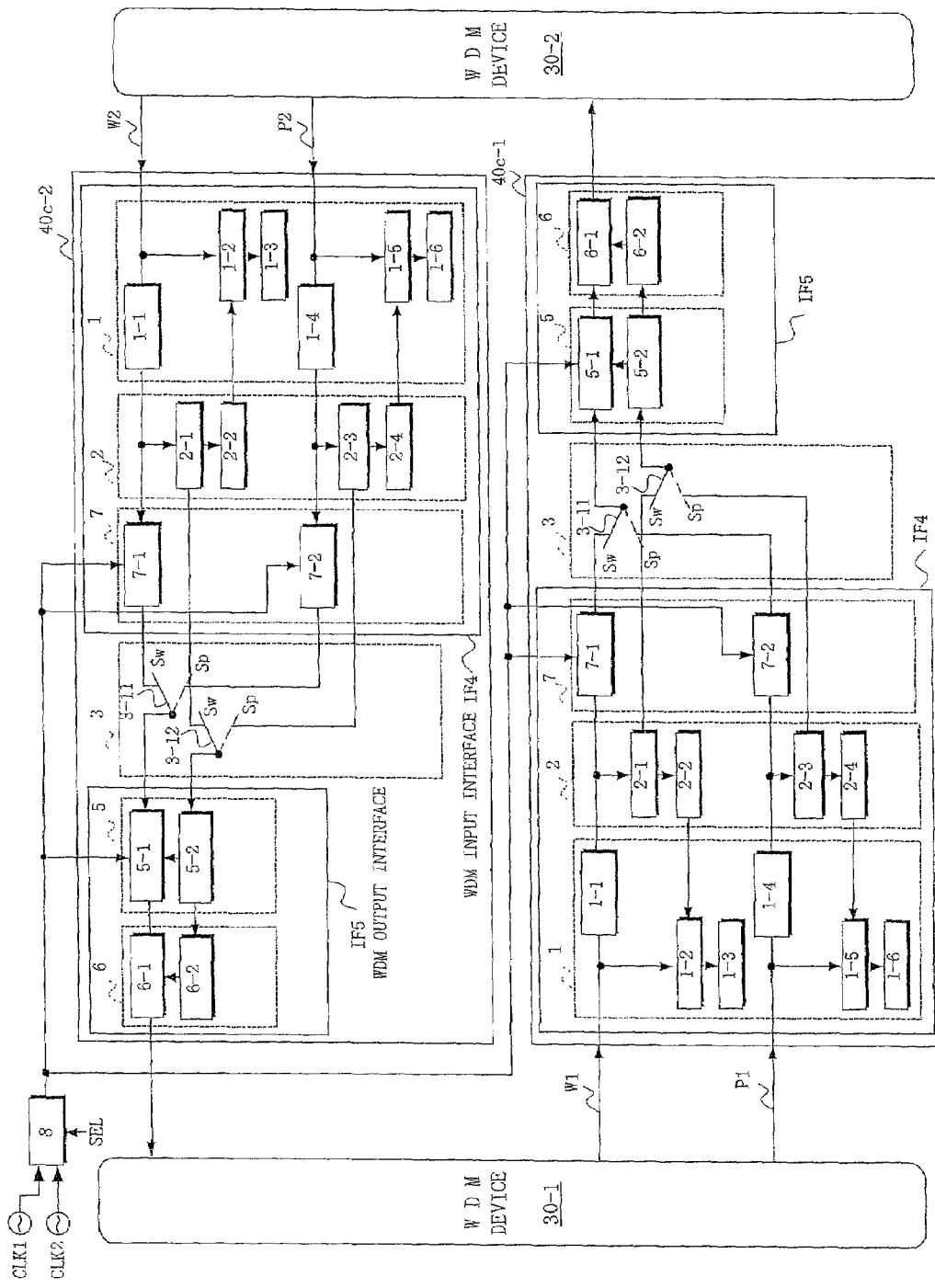
FIG. 11 is a block diagram showing an application, between WDM devices, of an embodiment (3) of a redundant changeover apparatus according to the present invention.

FIG. 11 shows an application example of the embodiment (3) of the in-apparatus synchronous system-redundant changeover apparatus shown in FIG. 5, which is connected between the WDM devices 30-1 and 30-2 to serve the relaying node function as in the application example of the embodiment (1) in FIG. 7.

Namely, in the counter clockwise direction from the WDM device 30-1 to the WDM device 30-2, an in-apparatus synchronous system-redundant changeover apparatus 40c-1 is inserted, while in the clockwise direction from the WDM device 30-2 to the WDM device 30-1, an in-apparatus synchronous system-redundant changeover apparatus 40c-2 is inserted.

These redundant changeover apparatuses 40c-1 and 40c-2 have the same arrangement as the embodiment (3) shown in FIG. 5.

In this case, the frame terminal portion 1, the frequency generator 2, and the reference clock changing portion 7 form a WDM input interface IF4, and the frequency regenerator 5 and the frame generator 6 form a WDM output interface IF5.

Thus, even in the case where the redundant changeover apparatus adopts the in-apparatus synchronous system, the redundant changeover between the WDM devices can be performed without frame synchronization loss.

Figure 12:
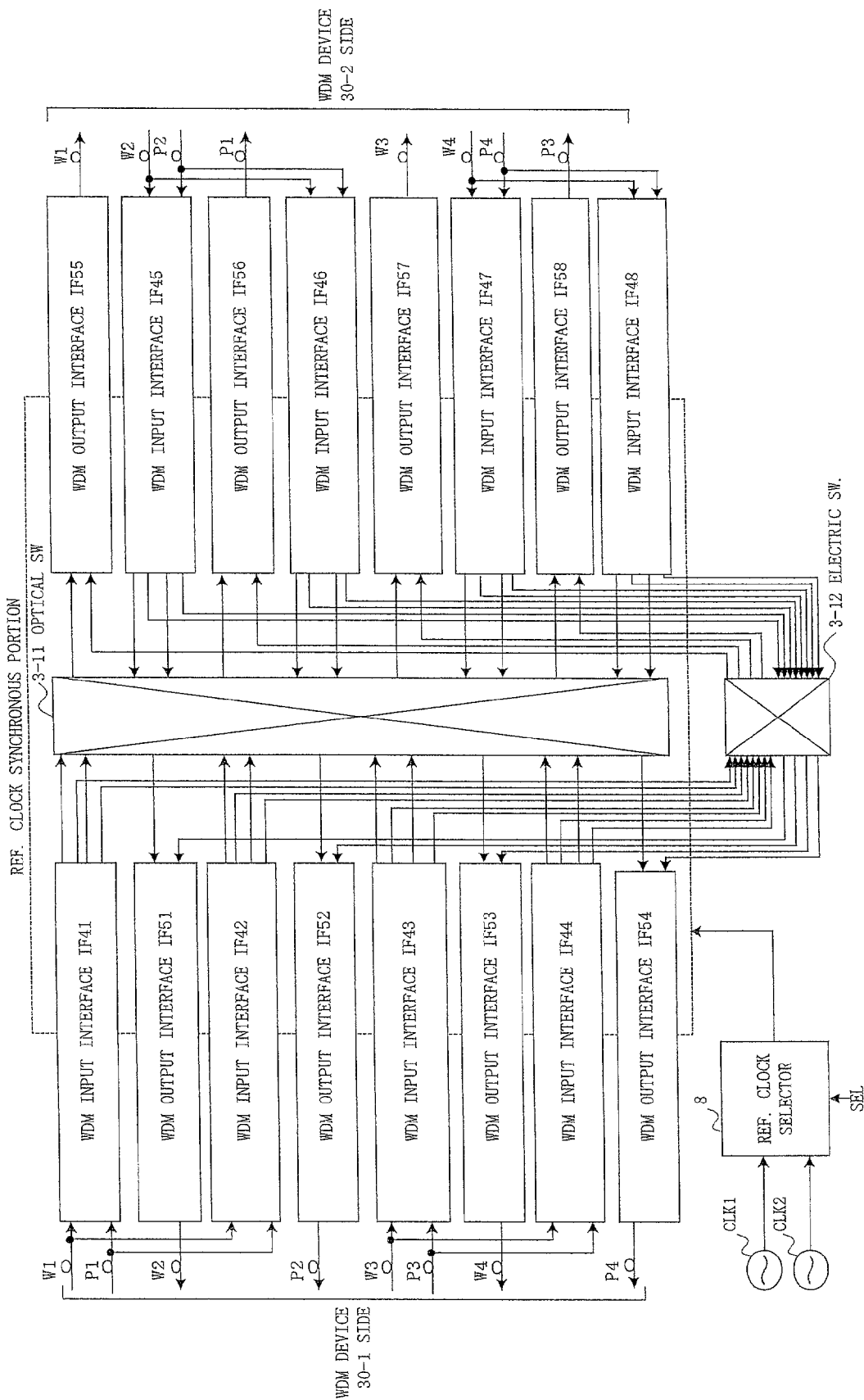
FIG. 12 is a block diagram showing a modification to the application of the embodiment (3) shown FIG. 11.

FIG. 12 shows a modification of the application example of the embodiment (3) shown in FIG. 11. Also in this modification, the embodiment (3) shown in FIG. 5 is inserted in the working transmission lines W1-W4 and the protection transmission lines P1-P4 connected between the WDM device 30-1 and WDM device 30-2 in the same manner as the application example in FIG. 11.

In addition, an optical switch and an electric switch are provided as the changeover switches 3-11 and 3-12 commonly to the interfaces.

It is to be noted that to the interfaces the reference clock is furnished from the reference clock selector 8.

For this purpose, WDM input interfaces IF41-IF44 having the same arrangement as the WDM input interface IF4 shown in FIG. 11 and WDM output interfaces IF51-IF54 having the same arrangement as the WDM output interface IF5 are inserted.

Namely, between the WDM device 30-1 and the optical switch 3-11 or the electric switch 3-12, two WDM input interfaces IF41 and IF42 are connected in parallel to the transmission line W1, and two WDM input interfaces IF43 and IF44 are connected in parallel to the transmission lines W3 and P3.

Also, the WDM output interfaces IF51 and IF52 are respectively inserted in the transmission lines W2 and P2, and the WDM output interfaces IF53 and IF54 are inserted in the transmission lines W4 and P4.

Between the optical switch 3-11 or the electric switch 3-12 and the WDM device 30-2, WDM output interfaces IF55 and IF56 are inserted in the transmission lines W1 and P1, and WDM input interfaces IF45 and 46 are inserted in the transmission lines W2 and P2.

Similarly in the transmission lines W3 and P3, WDM output interfaces IF57 and IF58 are inserted, and in the transmission lines W4 and P4, WDM input interfaces IF47 and IF48 are inserted.

Figure 13:
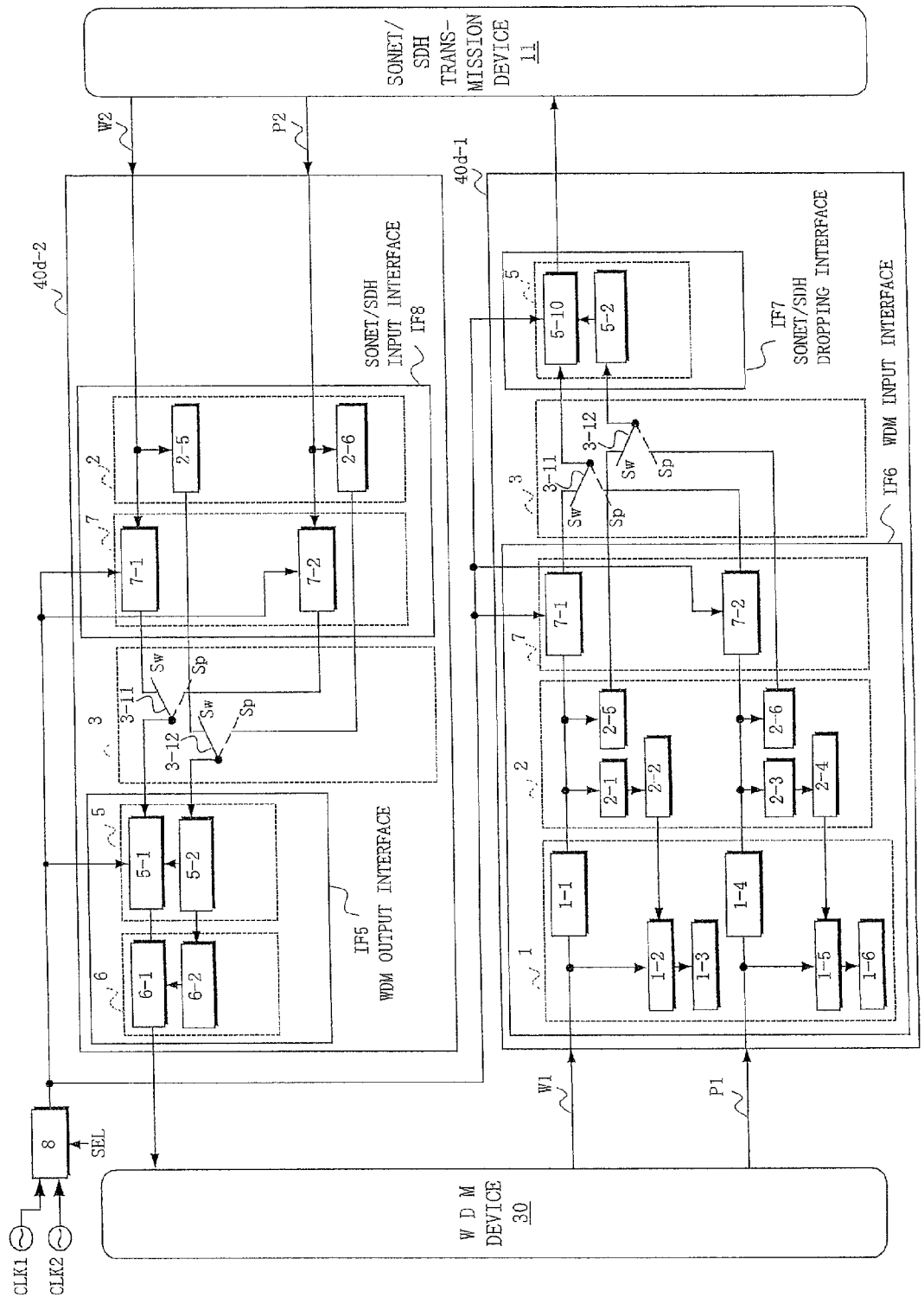
FIG. 13 is a block diagram showing an application, for adding/dropping, of the embodiment (4) of a redundant changeover apparatus according to the present invention.

FIG. 13 shows an application example of the embodiment (4) shown in FIG. 6

In this application example, for the embodiment (4), redundant changeover apparatuses 40d-1 and 40d-2 of an in-apparatus synchronous system are inserted between the WDM device 30 and the SONET/SDH transmission device 11.

In this case, the arrangement of the redundant changeover apparatus 40d-1 is the same as that of the embodiment (4) in FIG. 6, whereas the redundant changeover apparatus 40d-2 requires no frame terminal portion to the working signal and the protection signal from the SONET/SDH transmission device 11 so that those signals are directly inputted to the frequency generator 2 which forms a SONET/SDH input interface IF8 in combination with the reference clock changing portion 7.

It is to be noted that the transmission frequency clock extractor 2-1 and the PLL circuit 2-2 used in the embodiment (4) are not required also in the frequency generator 2.

In this way, an in-apparatus synchronous system-redundant changeover is achieved between the WDM device 30 and the SONET/SDH transmission device.

Figure 14:
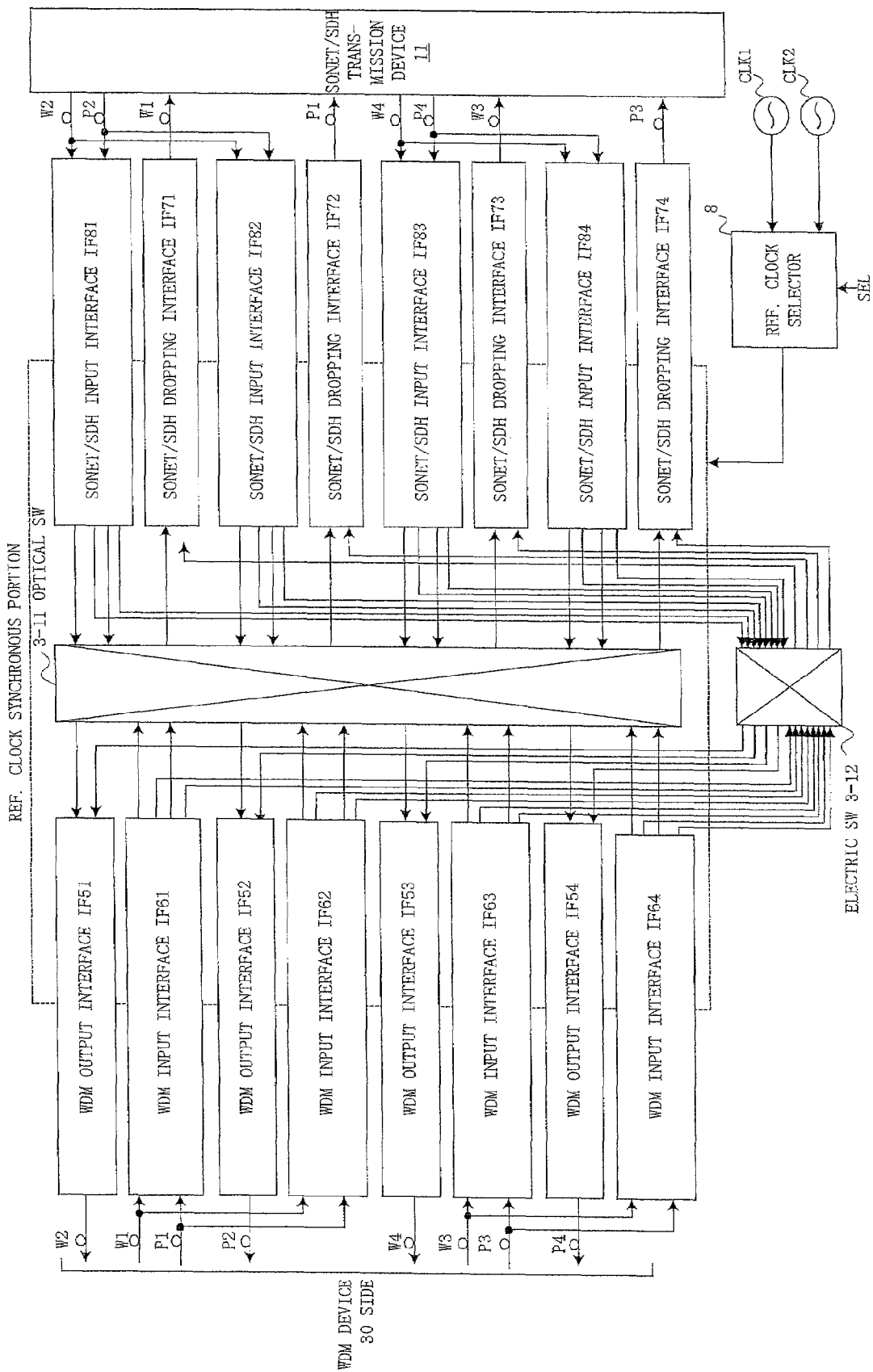
FIG. 14 is a block diagram showing a modification to the application of the embodiment (4) shown FIG. 13.

FIG. 14 shows a modification of the application example of the embodiment (4) shown in FIG. 13.

Also in this modification, the WDM device 30 and SONET/SDH transmission devices 11 are connected through the working transmission lines W1-W4 and the protection transmission lines P1-P4.

Additionally, between the WDM device 30 and the switches 3-11, 3-12, the WDM input interfaces IF61 and IF62 are connected in parallel to the transmission lines W1 and P1, and the WDM input interfaces IF63 and IF64 are connected in parallel to the transmission lines W3 and P3.

In the transmission lines W2 and P2, the WDM output interfaces IF51 and IF52 are respectively inserted, and in the transmission lines W4 and P4, the WDM output interfaces IF53 and IF54 are inserted.

Furthermore, between the optical switch 3-11 and the SONET/SDH transmission device 11, the SONET/SDH dropping interfaces IF71 and IF72 are inserted in the transmission lines W1 and P1, and the SONET/SD H dropping interfaces IF73 and IF74 are inserted in the transmission lines W3 and P3.

In the transmission lines W2 and P2, SONET/SDH input interfaces IF81 and IF82 are inserted in parallel, and in the transmission lines W4 and P4, SONET/SDH input interfaces IF83 and IF84 are inserted in parallel.

Also in this modification, the optical switch 3-11 and the electric switch 3-12 form the changeover portion 3 as in the case of the modification shown in FIG. 12.

As described above, a redundant changeover apparatus according to the present invention is arranged such that in case of as an in-apparatus asynchronous system, when two input signals which are mutually asynchronous in phase are changed over, a PLL circuit and a clock changing unit transmit signals with clocks before the changeover being gradually changed to clocks after the changeover, or in case of an in-apparatus synchronous system, data are separated from clocks so that the data are once changed to data with the reference clock and then for the data, the clocks before the changeover is gradually changed to clocks after the changeover. Therefore, frame phases are not rapidly varied, so that frame synchronized state can be maintained in the latter receiver.

Accordingly, the present invention can achieve a transparent transmission of any signals because of an asynchronous network, in which a redundant changeover can be performed without synchronization loss spreading over the network in its entirety.

Because of the transparency, it becomes possible to connect a redundant changeover apparatus to an asynchronous multiplexing transmission line such as WDM, and directly connect, to a network, the transmission signal which was required to be format-converted into e.g. SONET/SDH in the past because the frame is generated from arbitrary data.

In case of a SONET/SDH transmission device, it has been required to perform pointer processing for absorbing the difference between device frequency and input frequency to change an input signal to device clocks, whereas in the present invention no pointer processing is required because the input signal is linearly followed by device clocks, enabling a transparent transmission including clocks.

Furthermore, it is possible to construct a network (ring network) like a synchronous network by means of overhead having an equal function to SONET/SDH.

Also, upon occurrence of line failures or the like in the WDM device, which lacks a redundant changeover function, it becomes unnecessary to make redundant changeover in SONET/SDH devices forming a subordinate network in the presence of the redundant changeover apparatus. Accordingly, for network signals to be multiplexed, it becomes unnecessary to frequently change the frame format or transmission speed for example at the time of redundant changeover within SONET/SDH devices.

Furthermore, without being multiplexed with e.g. SONET/SDH signals, direct WDM of arbitrary transmission signals will cause no line disconnection due to the redundant changeover.

What we claim is:

1. A redundant changeover apparatus comprising:
    a changeover unit to change over from one to another of two input signals which are mutually asynchronous in phase,
    an extracting unit to extract a clock from an output signal of the changeover unit,
    a PLL circuit to receive the clock from the extracting unit and to output an output clock,
    a clock changing unit to receive the output signal with the output clock of the PLL circuit, and
    a framing unit to frame output data of the clock changing unit with the output clock.

2. The redundant changeover apparatus as claimed in claim 1 wherein the input signals comprise a working input signal and a protection input signal from a wavelength division multiplexing device forming a ring network.

3. The redundant changeover apparatus as claimed in claim 1 wherein the input signals comprise a working input signal and a protection input signal from an arbitrary transmission device of a client.

4. The redundant changeover apparatus as claimed in claim 1 wherein the changeover unit comprises an optical switch.

5. The redundant changeover apparatus as claimed in claim 1 wherein the clock changing unit comprises the PLL circuit.

6. A redundant changeover apparatus comprising:
two extracting units to extract data and a clock respectively of two input signals which are mutually asynchronous in phase,
a first and a second reference clock changing unit to change the respective data with a reference clock inputted externally,
a first changeover unit to change over from one to another of data respectively outputted from the first and the second reference clock changing unit,
a second changeover unit to change over from one to another of clocks extracted by the extracting units,
a PLL circuit to receive the clock from the second changeover unit and to output an output clock, and
a clock changing unit to change output data of the first changeover unit from a clock before the changeover to an output clock of the PLL circuit.

7. The redundant changeover apparatus as claimed in claim 6 wherein the reference clock comprises an in-house clock or a free-running clock.

8. The redundant changeover apparatus as claimed in claim 6 wherein the clock extracting unit extracts a clock from a wavelength division multiplexing device.

9. The redundant changeover apparatus as claimed in claim 6 wherein the first changeover unit comprises an optical switch and the second changeover unit comprises an electric switch.

10. The redundant changeover apparatus as claimed in claim 6 wherein the input signals comprise a working input signal and a protection input signal from a wavelength division multiplexing device forming a ring network.

11. A node device comprising:
redundant changeover apparatuses, provided in duplicate for same transmission lines of a working system and a protection system,
each redundant changeover apparatus comprises a changeover unit to change over from one to another of two input signals which are mutually asynchronous in phase, an extracting unit to extract a clock from an output signal of the changeover unit, a PLL circuit to receive the clock from the extracting unit and to output an output clock, a clock changing unit to receive the output signal with the output clock of the PLL circuit, and a framing unit to frame output data of the clock changing unit with the output clock, and generates outputs of the clock changing unit of the working system and the protection system.

12. The node device as claimed in claim 11 wherein the changeover unit is commonly provided for each redundant changeover apparatus.

* * * * *